(12) United States Patent
Azeroual et al.

(10) Patent No.: US 11,004,778 B1
(45) Date of Patent: May 11, 2021

(54) POLYGONAL BGA SEMICONDUCTOR PACKAGE

(71) Applicant: Marvell Israel (M.I.S.L) Ltd., Yokne'am (IL)

(72) Inventors: Dan Azeroual, Kiriat Ata (IL); William Bruce Weiser, Nampa, ID (US)

(73) Assignee: Marvell Israel (M.I.S.L) Ltd., Yokne'am (IL)

( * ) Notice: Subject to any disclaimer, the term of this patent is extended or adjusted under 35 U.S.C. 154(b) by 0 days.

(21) Appl. No.: 16/583,541

(22) Filed: Sep. 26, 2019

Related U.S. Application Data (60) Provisional application No. 62/740,292, filed on Oct. 2, 2018, provisional application No. 62/738,370, filed on Sep. 28, 2018.

(51) Int. Cl.
*H01L 23/52* (2006.01)
*H01L 23/498* (2006.01)
*H01L 23/00* (2006.01)
*H01L 23/31* (2006.01)

(52) U.S. Cl.
CPC .... *H01L 23/49816* (2013.01); *H01L 23/3128* (2013.01); *H01L 23/49838* (2013.01); *H01L 24/14* (2013.01); *H01L 2924/14* (2013.01); *H01L 2924/15158* (2013.01); *H01L 2924/15311* (2013.01)

(58) Field of Classification Search
CPC ........... H01L 23/3128; H01L 23/49816; H01L 23/49838; H01L 24/14
USPC ......................................................... 257/738
See application file for complete search history.

(56) References Cited

U.S. PATENT DOCUMENTS

| | | | | |
|---|---|---|---|---|
| 6,153,506 | A * | 11/2000 | Kermani | H01L 23/13 257/784 |
| 6,388,318 | B1 * | 5/2002 | Iwaya | H01L 21/563 257/723 |
| 9,089,060 | B1 | 7/2015 | Azeroual et al. | |
| 9,867,282 | B2 * | 1/2018 | Hu | H05K 3/0052 |
| 9,911,716 | B2 * | 3/2018 | Davis | H01L 23/3675 |
| 2008/0119012 | A1 * | 5/2008 | Fan | H01L 21/67126 438/112 |

* cited by examiner

*Primary Examiner* — Luan C Thai (57) ABSTRACT

A ball grid array (BGA) package for an integrated circuit device includes an integrated circuit device having a plurality of terminals, and two largest dimensions that define a major plane. A package substrate material encloses the integrated circuit device, and is formed, in a plane parallel to the major plane, into a polygon having at least five sides. An array of contacts on an exterior surface of the package substrate material is electrically coupled to the plurality of terminals. Contacts in the array of contacts are distributed in a pattern of contact positions, and the center of each contact position may be separated from the center of each nearest other position by a separation distance that is identical throughout the pattern. Each position may be occupied by a contact, or positions in a sub-pattern may lack a contact and may be available for insertion of at least one via.

22 Claims, 5 Drawing Sheets

POLYGONAL BGA SEMICONDUCTOR PACKAGE

CROSS REFERENCE TO RELATED APPLICATION

This disclosure claims the benefit of commonly-assigned United States Provisional Patent Applications Nos. 62/738,370, filed Sep. 28, 2018, and 62/740,292, filed Oct. 2, 2018, each of which is hereby incorporated by reference herein in its respective entirety.

FIELD OF USE

This disclosure relates to a polygonal ball-grid array (BGA) semiconductor package. More particularly, this disclosure relates to a polygonal ball-grid array (BGA) semiconductor package having at least five sides, with reduced signal skew and reduced high-frequency losses.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

A ball grid array (BGA) is a type of surface-mount packaging used for integrated circuits. A BGA package includes an array of solder balls on a surface of the BGA package. Any individual solder ball may be coupled to a pin of an integrated circuit device within the BGA package. When the BGA package is assembled to a printed circuit board (PCB), electrical connections are formed using the array of solder balls to couple an integrated circuit device within the BGA package to other circuits and interfaces on the PCB.

SUMMARY

In accordance with implementations of the subject matter of this disclosure, a ball grid array (BGA) package for an integrated circuit device includes an integrated circuit device having two largest dimensions that define a major plane, the integrated circuit device having a plurality of terminals, a package substrate material enclosing the integrated circuit device, the package substrate material being formed, in a plane parallel to the major plane of the integrated circuit device, into a polygon having at least five sides, and an array of contacts on an exterior surface of the package substrate material, with individual contacts within the array of contacts being electrically coupled to individual terminals in the plurality of terminals.

In a first implementation of such a BGA package, the package substrate material may be formed, in the plane parallel to the major plane of the integrated circuit device, into a hexagon.

In a second implementation of such a BGA package, the package substrate material may formed, in the plane parallel to the major plane of the integrated circuit device, into an octagon.

In a third implementation of such a BGA package, contacts in the array of contacts, that are located on a surface of a portion of the package substrate material that intersects any normal to the major plane of the integrated circuit device, may be coupled to power terminals of the integrated circuit device.

In that third implementation, contacts in the array of contacts that are located on a surface of a portion of the package substrate material other than the portion that intersects any normal to the major plane of the integrated circuit device may be coupled to input/output terminals of the integrated circuit device.

In a fourth implementation of such a BGA package, contacts in the array of contacts may be distributed in a pattern of contact positions, in which each contact position has a center, and the center of each contact position is separated from the center of each nearest other position by a separation distance that is identical throughout the pattern.

In one variant of that fourth implementation, each contact position in the pattern may be occupied by a contact.

In a second variant of that fourth implementation, in at least a portion of the package, (1) the pattern of contact positions may be divided into a first sub-pattern of contact positions and a second sub-pattern of contact positions, the second sub-pattern of contact positions being interspersed within the first sub-pattern of contact positions, (2) each contact position in the first sub-pattern may be occupied by a contact, and (3) each contact position in the second sub-pattern may lack a contact and may be available for insertion of at least one via.

In that second variant of the fourth implementation, at at least one contact position in the second sub-pattern, a via having a first diameter may be inserted, and at least one additional via, having a second diameter smaller than the first diameter, may be inserted adjacent the via having the first diameter. The at least one additional via may include a plurality of additional vias, each having the second diameter, distributed equiangularly around the via having the first diameter.

In that second variant of the fourth implementation, the second sub-pattern of contact positions may consist of every third position in the pattern of contact positions.

In that second variant of the fourth implementation the at least a portion of the package may include any portion of the package that intersects any normal to the major plane of the integrated circuit device.

A method in accordance with implementations of the subject matter of this disclosure for fabricating a ball grid array (BGA) package for an integrated circuit device, where the integrated circuit device has two largest dimensions that define a major plane, and the integrated circuit device further has a plurality of terminals, includes forming a package substrate material into a shape, in a plane parallel to the major plane of the integrated circuit device, that is a polygon having at least five sides, providing a package substrate material having an array of contacts on an exterior surface of the package substrate material, enclosing the integrated circuit device within the package substrate material, and electrically coupling individual contacts within the array of contacts to individual terminals in the plurality of terminals.

In a first implementation of such a method, forming the package substrate material may include forming the package substrate material into a hexagonal shape.

In a second implementation of such a method, forming the package substrate material may include forming the package substrate material into an octagonal shape.

A third implementation of such a method may further include coupling contacts in the array of contacts, that are located on a surface of a portion of the package substrate material that intersects any normal to the major plane of the integrated circuit device, to power terminals of the integrated circuit device.

That third implementation of such a method may further include coupling contacts in the array of contacts, that are located on a surface of a portion of the package substrate material other than the portion that intersects any normal to the major plane of the integrated circuit device, to input/output terminals of the integrated circuit device.

In a fourth implementation of such a method, the forming the array of contacts may include distributing the contacts in a pattern of contact positions, in which each contact position has a center, and the center of each contact position is separated from the center of each nearest other position by a separation distance that is identical throughout the pattern.

In a first variant of that fourth implementation of such a method, the distributing the contacts in the pattern of contact positions may include placing a contact in each contact position in the pattern.

In a second variant of that fourth implementation of such a method, the distributing the contacts in the pattern of contact positions may include, in at least a portion of the package substrate material, placing a contact in each contact position in a first sub-pattern of contact positions within the pattern of contact positions, and leaving each contact position in a second sub-pattern of contact positions, interspersed within the first sub-pattern of contact positions, available for insertion of a via.

That second variant of the fourth implementation of the method may further include inserting, at at least one contact position in the second sub-pattern, a via having a first diameter, and inserting at least one additional via, having a second diameter smaller than the first diameter, adjacent the via having the first diameter.

That second variant of the fourth implementation of the method may further include inserting a plurality of additional vias, each having the second diameter, distributed equiangularly around the via having the first diameter.

In the second variant of the fourth implementation of the method, leaving each contact position in the second sub-pattern of contact positions available for insertion of a via may consist of leaving every third contact position in the pattern of contact positions available for insertion of a via.

In the second variant of the fourth implementation of the method the placing and the leaving may be performed only in the portion of the package substrate material, where the portion is characterized by intersecting any normal to the major plane of the integrated circuit device.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

As noted above, a BGA package includes an array of bump contacts, usually in the form of solder balls, on a surface of the BGA package. Any individual bump contact or ball may be coupled to a terminal or pin of an integrated circuit device within the BGA package. When the BGA package is assembled to a printed circuit board (PCB), electrical connections are formed using the array of bump contacts or balls to couple an integrated circuit device within the BGA package to other circuits and interfaces on the PCB.

Conventional BGA packages are square or rectangular. Typically, the bump contacts or balls near the center of the package, directly under the encapsulated integrated circuit wafer—i.e., in a portion of the package that intersects any normal to the major plane of the integrated circuit wafer (viz., the plane defined by the two larger dimensions, other than the thickness, of the integrated circuit wafer), are used for power and ground. Remaining bump contacts or balls near the periphery of the package—i.e., in a portion of the package that does not intersect any normal to the major plane of the integrated circuit wafer—are used for input/output pins.

There are a number of disadvantages to square or rectangular packages.

First, if there is any distortion of a printed circuit board (PCB) to which a package is bonded, at the location of the package, the differential motion, and therefore the stress on the bonds, between the package and the PCB, is greater as distance from the distortion point increases. Thus, if a PCB is bent at the location of a square or rectangular package on the PCB, the corners will suffer the most stress, which could lead to breakage of the bonds between the package and the PCB. Because the corners are normally used for redundant ground connections, breakage of those bonds usually will not result in complete failure of operation of the packaged device. However, the corner balls/bonds cannot be used for signal, because any broken bond will result in a functional failure.

Second, considering that the integrated circuit device enclosed in the package is normally placed at or near the center of the package, the distance in a square package from a pin to a contact near a corner will be about 41.4% (i.e., about (($\sqrt{2}$)−1), expressed as a percentage) longer than the distance from a pin to a contact near the center of a side. The different distances contribute to signal skew, and where high-frequency signals are used, losses in the longer paths are higher than losses in the shorter paths.

In accordance with implementations of the present disclosure, these and other disadvantages may be mitigated by providing a package that, rather than being a square or rectangle—i.e., rather than being a polygon having four sides—is a polygon having five or more sides. Particular implementations are regular polygons, which are both equiangular and equilateral.

A circular package might be an ideal solution, as it has no corners, and has a uniform distance from the center to any point on the circumference. But for manufacturing reasons, a circular package is not practical because it is difficult to make non-straight cuts in the package substrate material. There would also be a substantial amount of waste of the package substrate manufacturing panel between the circular shapes. Finally, a circular package could rotate in its carrier during transport, and therefore could be difficult to orient and place on a host PCB.

However, advantages of a circular package can be achieved with a polygon having a larger number of sides, because a polygon approaches a circle as the number of sides increases. Therefore in accordance with this disclosure a polygonal package having more than four sides (i.e., five or more sides) is provided. In determining the number of sides, there is a trade-off in manufacturing time and effort (because more cuts of the package substrate manufacturing panel are required), as well as substrate waste, as the number of sides increases.

One possible implementation according to this disclosure is a regular octagonal package. A regular octagonal package approaches a circle without requiring an excessive number of cuts. However, regular octagons of the same size do not tesselate with each other, so there is some manufacturing waste in various octagonal implementations.

On the other hand, regular hexagons of the same size do tesselate with each other, meaning that regular hexagonal packages can be cut from a rectangular substrate without waste except at the edges, as discussed in more detail below. Therefore, a second possible implementation according to this disclosure is a regular hexagonal package.

It has been proposed to arrange the bump or ball contacts so that the distance from any contact to any of its nearest neighbors is the same throughout the package. Such a relationship results in contacts that are grouped in equilateral triangles. The geometry of such an arrangement of bump or ball contacts, which has vertex angles of 60°, fits well within the geometry of a regular hexagon, which has an exterior angle of 60° at each vertex. Therefore, such an arrangement of bump or ball contacts may be used advantageously in implementations of the subject matter of this disclosure.

In accordance with further implementations of the subject matter of this disclosure, a modified equilateral triangular pattern of bump contacts or balls is used, in which every third bump or ball contact position in a row of bump or ball contact positions is left empty. Such a modified arrangement might be used only in a portion of the package, and particularly under the integrated circuit device itself where power connections are made. In such a modified arrangement, the empty positions are used for vias, providing increased ability to carry power, while minimizing the length of power conductors. Moreover, rather than placing a single via at that location, it has been found that impedance may be reduced if multiple smaller vias are used, as illustrated below.

The subject matter of this disclosure may be better understood by reference to FIGS. 1-9.

Figure 1:
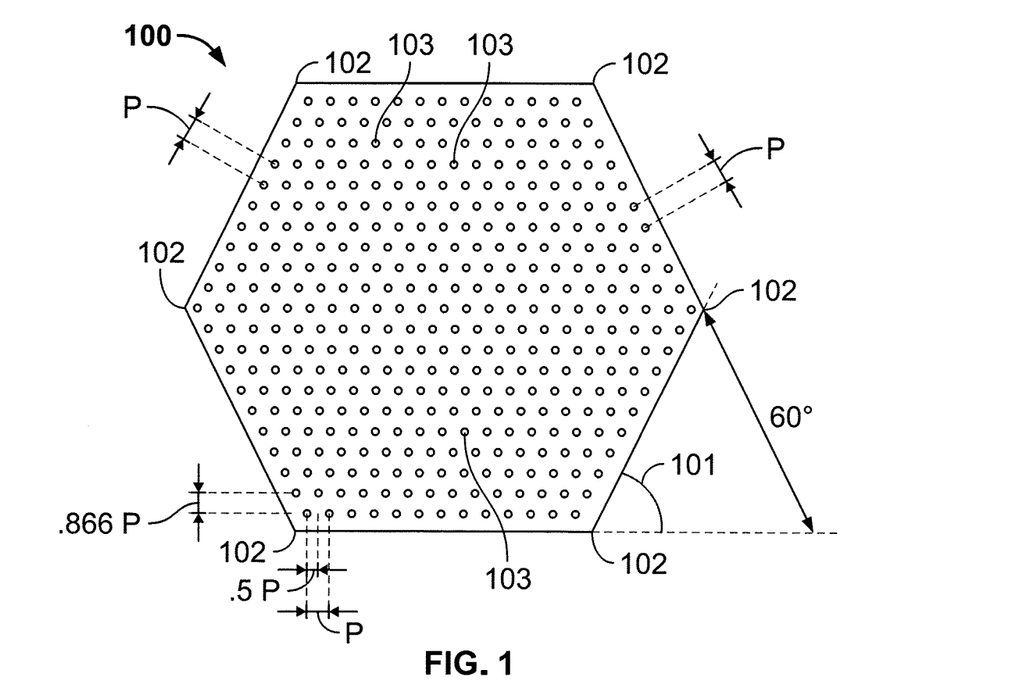
FIG. 1 shows the exterior of a BGA package in accordance with a hexagonal implementation of the subject matter of this disclosure, viewed from a bump contact or ball side of the package.

FIG. 1 shows the exterior of a BGA package 100 in accordance with a hexagonal implementation of the subject matter of this disclosure, viewed from a bump or ball contact side of the package 100. Such a package 100 may have one bump or ball contact side or, if it is intended for stacking with at least one other package, package 100 may have bump or ball contacts on two opposite sides.

As shown in FIG. 1, package 100 has the form of a regular hexagon, with a 60° exterior vertex angle 101 at each vertex 102. Although any pattern of bump contacts or balls 103 may be provided, in this implementation, bump contacts or balls 103 are arranged so that the distance, or pitch, P, from any one bump contact or ball 103 to any of its nearest neighbors 103 is the same. Thus, groups of adjacent bump contacts or balls 103 form equilateral triangles having side of length P. As seen, such a pattern fits neatly within hexagonal package 100, insofar as the vertex angles of the equilateral triangles match the exterior vertex angles 101 of package 100. In such a pattern, the horizontal rows of bump contacts or balls 103 are separated by 0.866 P (the altitude of an equilateral triangle of side P), and the vertical rows of bump contacts or balls 103 are separated by 0.5 P (one half the base of an equilateral triangle of side P).

Figure 2:
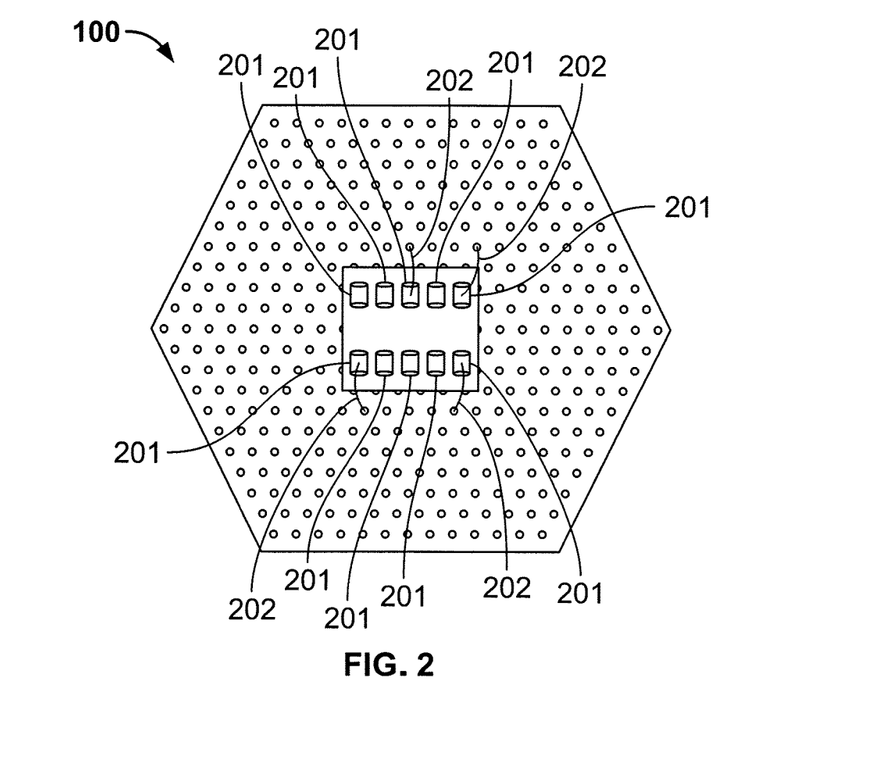
FIG. 2 is a view of the interior of the package of FIG. 1 seen from the midplane of the package.

As shown in FIG. 2, which is a view of the interior of package 100 seen from, e.g., the midplane of package 100, an integrated circuit device ("chip") 200 is enclosed in the center of package 100. Individual terminal contacts or pins 201 of device 200 may be coupled to appropriate ones of bump contacts or balls 103 of package 100 by wire bonding (examples shown at 202). Alternatively, terminal contacts or pins of device 200 may be coupled to appropriate ones of bump contacts or balls 103 of package 100 by controlled collapse chip connection ("C4") bonding, also known as "flip-chip" bonding, in which solder bumps or balls (not shown) are formed on device 200 and placed in contact with bump contacts or balls 103 of package 100.

As noted above, in a square package the distance from the center to a corner is about 1.414 times, or 41.4% longer than, the distance from the center to a center of a side. By comparison, in regular hexagonal package 100, the distance from the center to a vertex is only about 1.155 times, or 15.5% longer than, the distance from the center to a center of a side. Therefore, signal length, and signal attenuation (power loss), are reduced in a hexagonal package as compared to a square package or a rectangular package.

Similarly, for a given diagonal, the length of a side of a square package is about 0.71 times the length of the diagonal. However, for that given diagonal, the length of the side of a regular hexagonal package is 0.5 times the length of the diagonal. As noted above, stress on the bonds between the package and the PCB are greater as distance from the distortion axis increases. With shorter sides, the distance from a distortion axis to a corner is smaller, meaning that there is less stress at the corners. Moreover, the regular hexagonal package has a total perimeter length of 3 times the diagonal, whereas for the same diagonal, a square package has a total perimeter length of about 2.83 times the diagonal. Thus, the regular hexagonal package has more perimeter available for input/output connections.

Figure 3:
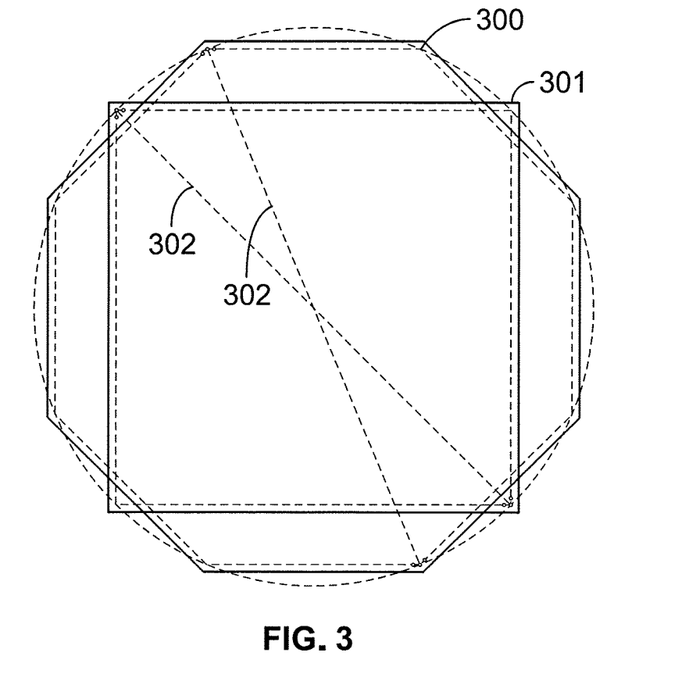
FIG. 3 is a comparison of a BGA package in accordance with an octagonal implementation of the subject matter of this disclosure to a square BGA package.

The advantages are similar for an octagonal package. FIG. 3 superimposes a regular octagonal package 300 over a square package 301 having the same diagonal 302.

First, as previously noted, in square package 301 the distance from the center to a corner is about 1.414 times the distance from the center to a center of a side. But in regular octagonal package 300, the distance from the center to a corner is only about 1.082 times, or 8.2% longer than, the distance from the center to a center of a side.

Second, as previously noted, for a given diagonal, the length of a side of a square package is about 0.71 times the length of the diagonal. However, for that given diagonal, the length of the side of a regular octagonal package is about 0.38 times the length of the diagonal, with proportional reduction in stress at the corners. And the regular octagonal package has a total perimeter length of about 3.06 times the diagonal, whereas for the same diagonal, a square package has a total perimeter length of about 2.83 times the diagonal. Thus, the regular octagonal package has more perimeter available for input/output connections.

The regular octagonal package may be somewhat better than the regular hexagonal package, based on dimensions, with respect to reducing corner stresses, providing more uniform distances from the center to the edge, and providing more perimeter space for signals. On the other hand, there is no special relationship between the bump contact or ball array pattern and the geometry of the regular octagonal package as there is in the case of the regular hexagonal package, meaning that, for some arrangements of bump contacts or balls, the regular octagonal package is slightly less efficient than the regular hexagonal package in usage of package area by the bump contacts or balls.

Figure 4:
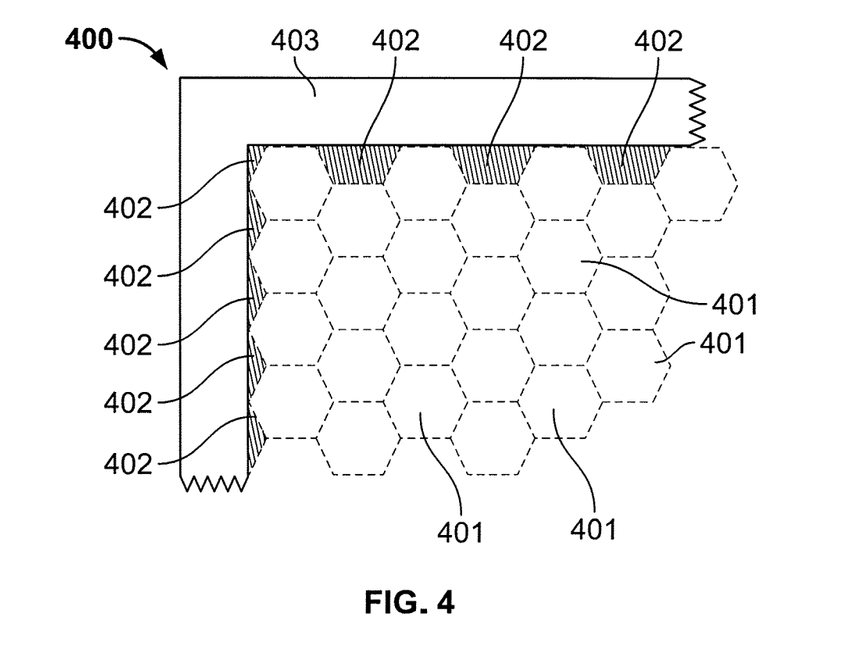
FIG. 4 shows a package substrate manufacturing panel divided into hexagonal package substrates.

In addition, as noted above, regular octagons of the same size do not tesselate with each other, while regular hexagons of the same size do tesselate with each other. Therefore, in various fabrication processes, there is less manufacturing waste in the case of a hexagonal package than in the case of an octagonal package. As seen in FIG. 4, which depicts a package substrate panel 400 divided into hexagonal package substrates 401, there is only a small amount of waste in shaded areas 402 near the edges of panel 400. Moreover, it may be possible to move some of the tooling holes and other manufacturing features that are normally placed in panel edges 403 at least partially into "waste" areas 402, which could allow panel edges 403, which are themselves waste, to be made smaller.

However, the reduction of waste in the case of a hexagonal package as compared to an octagonal package comes at the cost of more intricate cutting to create a hexagonal package. As compared to the cutting pattern seen in FIG. 4 for creating hexagonal packages, creating octagonal packages requires a simpler cutting process in which the substrate is cut into squares, and then an octagon is fabricated by making straight cuts to remove the corners.

Thus each of the hexagonal and octagonal shapes has its respective advantages and disadvantages relative to one another, with the octagonal shape allowing a more straightforward fabrication process, while the hexagonal shape potentially prevents material waste. But both the hexagon and the octagon (as well as other polygons having five or more sides) offer various other advantages, as described elsewhere in this disclosure, over a rectangular-shaped substrate.

As discussed above, a pattern of bump contacts or balls 103 that is arranged so that the distance, or pitch, P, from the center of any one bump contact or ball 103 to the center of any of its nearest neighbors 103 is the same, whereby groups of adjacent bump contacts or balls 103 form equilateral triangles of side P, fits neatly within hexagonal package 101, insofar as the vertex angles of the equilateral triangles match the exterior vertex angles 101. Therefore, such a pattern for balls or bump contacts may be used advantageously with a hexagonal package.

Figure 5:
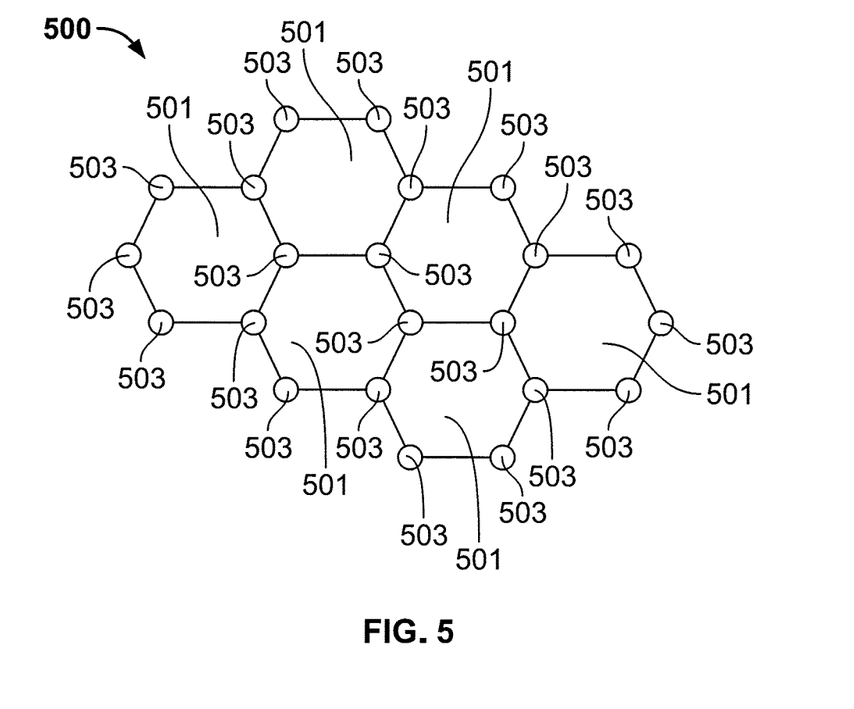
FIG. 5 shows a variant pattern of bump contacts or balls in an implementation of the subject matter of this disclosure.

In a variant of such pattern of bump contacts or balls 103, every third bump contact or ball in a given row may be omitted, in a staggered arrangement 500 as shown in FIG. 5, where the bump contacts or balls 503 are arranged in a pattern of interlocking hexagons 501, similar to the arrangement of package substrates 401 on package panel 400. As discussed in more detail below, the empty areas in such a staggered pattern 500 may be useful for power connections.

Figure 6:
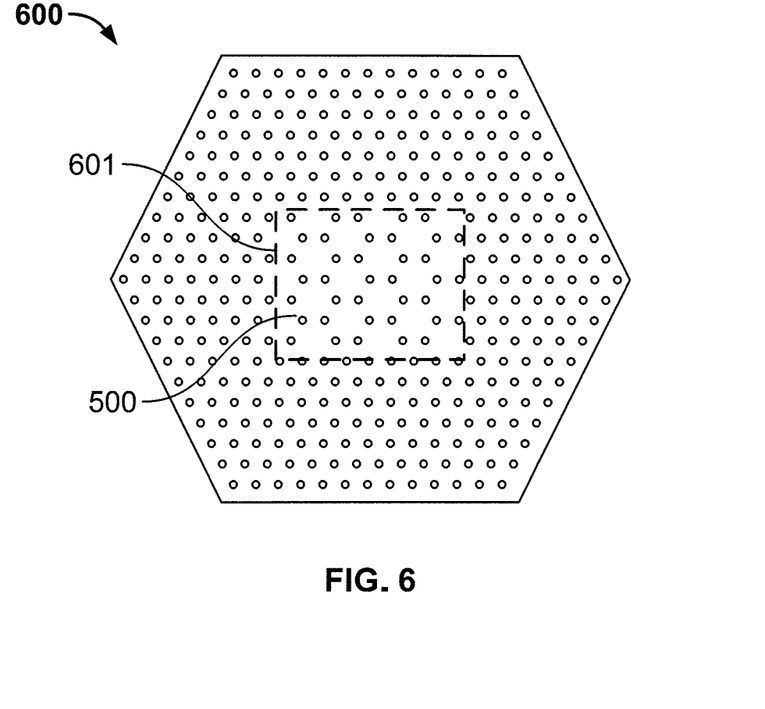
FIG. 6 shows the use of the pattern of FIG. 5 in only a portion of a BGA package in accordance with a hexagonal implementation of the subject matter of this disclosure.

As shown in FIG. 6, staggered pattern 500 need not be used in the entire package, but could be restricted to only a portion of a package 600, such as the portion under area 601 where the integrated circuit device is mounted. This leaves room for extra vias between bump contacts or balls 503 to be used for power connections for the integrated circuit device.

Figure 7:
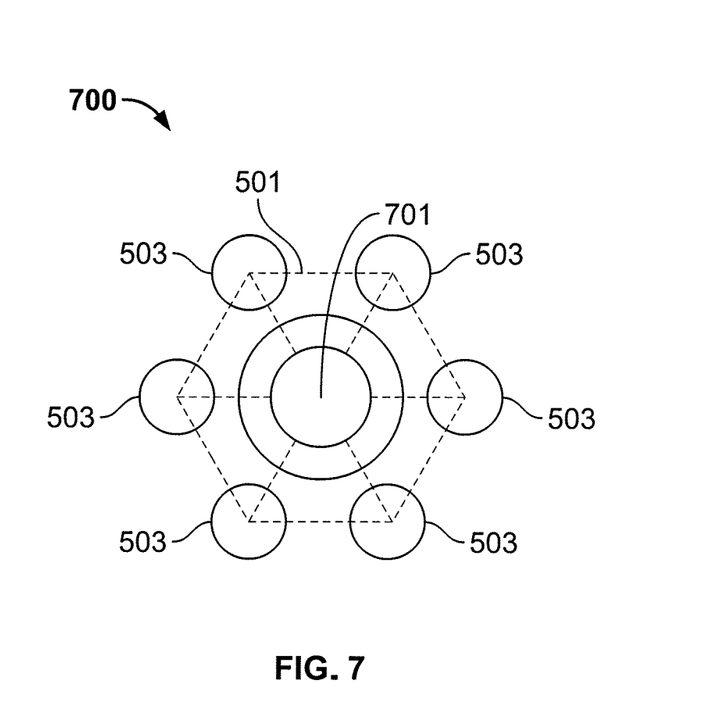
FIG. 7 shows an arrangement of contacts with a power via in in accordance with an implementation of the subject matter of this disclosure.

In one arrangement 700 shown in FIG. 7, one large added via 701 is provided within each hexagonal space 501. In an alternate arrangement 800 shown in FIG. 8, one medium via 801 having about the same diameter as one of bump contacts or balls 503, is surrounded by a plurality (e.g., three) smaller vias 802. Arrangement 700 may have lower DC resistance than arrangement 800, and therefore arrangement 700 may be preferable for various low frequency applications. However, for higher frequency applications—e.g., in the gigahertz range—the contribution to impedance from inductance becomes noticeable.

Figure 8:
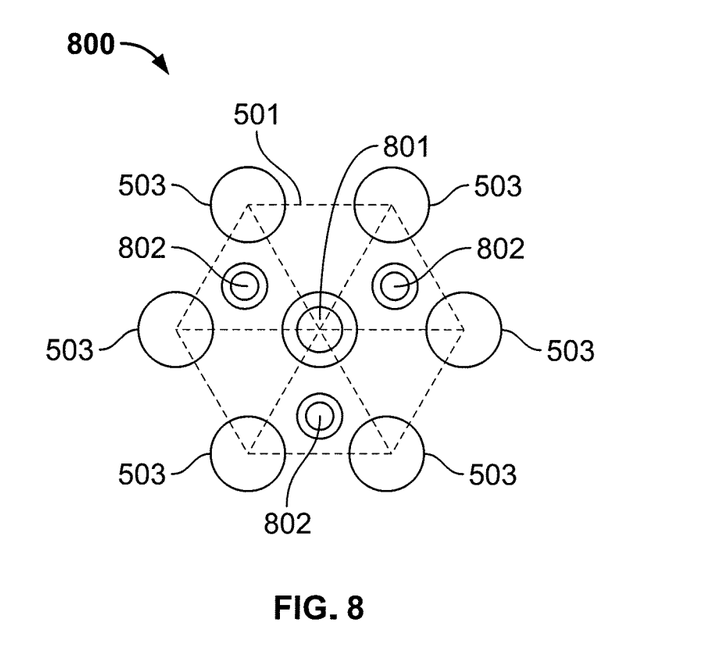
FIG. 8 shows an arrangement of contacts with a plurality of power vias in in accordance with an implementation of the subject matter of this disclosure.

The inductance L (measured in nanohenries, nH) of a via of diameter d in a substrate of thickness t (where d and t are measured in millimeters) is:

$$L_{via}=0.2t(\ln(4t/d+1))$$

It has been observed that for t=1.6 mm and d=1.0 mm in FIG. 7 or d=0.2 mm and 0.4 mm in FIG. 8, the inductance of the single larger via 701 of FIG. 7 is 0.64 nH, while the total inductance of the four vias 801, 802 in FIG. 8 is 0.26 nH. Therefore, arrangement 800 of FIG. 8 may be preferable in high-frequency applications.

Figure 9:
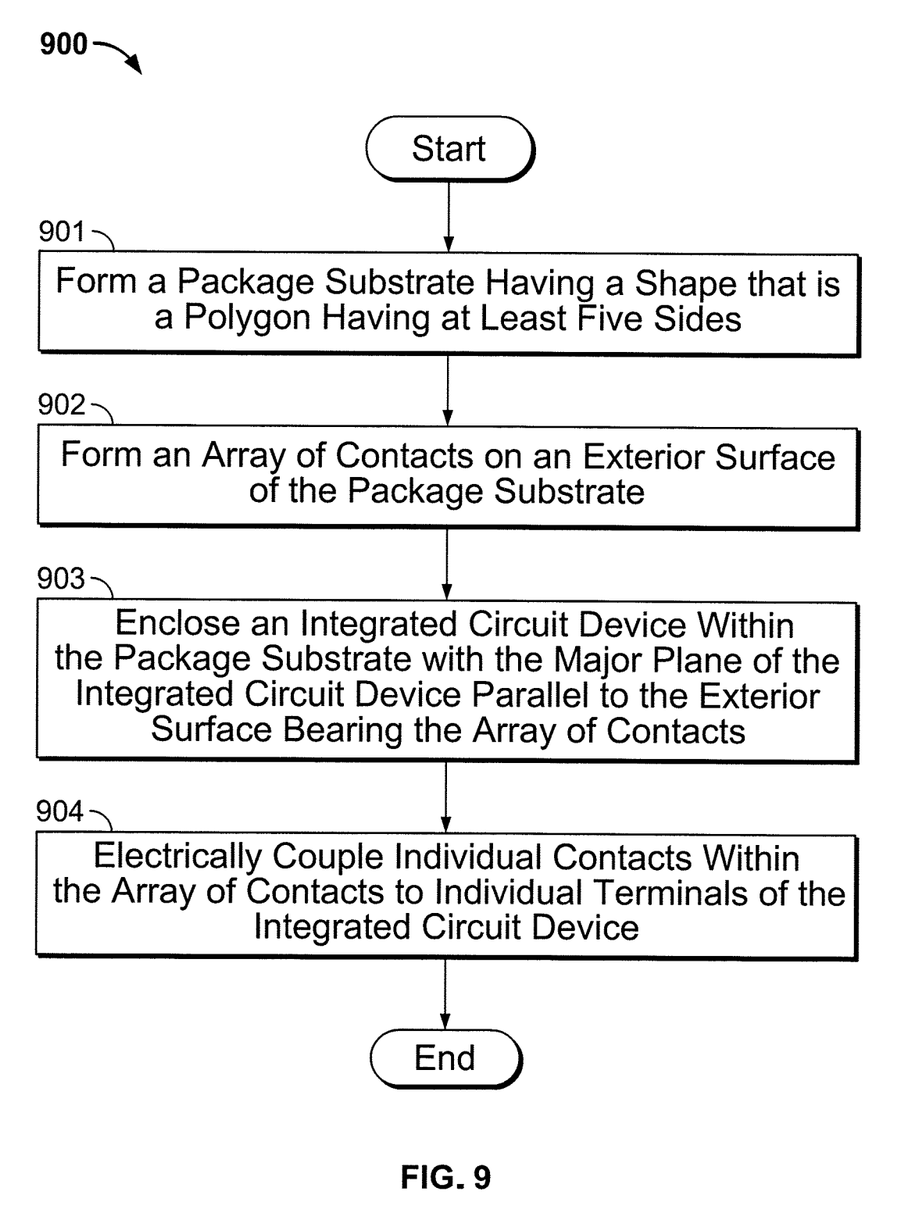
FIG. 9 is a flow diagram illustration a method in accordance with an implementation of the subject matter of this disclosure for forming a BGA package.

A method 900 of forming a polygonal BGA semiconductor package in accordance with implementations of the subject matter of this disclosure is diagrammed in FIG. 9. Method 900 begins at 901, where a package substrate is formed with a shape that is a polygon with at least five sides, and in particular implementations the shape is a regular polygon with at least five sides. The polygon may be formed by making suitable straight cuts in a sheet or panel of substrate material, which ordinarily may be square or rectangular.

At 902, an array of contacts is formed on an exterior surface of the package substrate. In some implementations, the array of contacts may be formed after the polygonal substrate is cut from the sheet or panel of substrate material, while in other implementations the sheet or panel of substrate material may be formed with the array of contacts, before the polygonal substrate is cut from the sheet or panel of substrate material. However, in the latter case it may be difficult to avoid cutting through a contact.

At 903, an integrated circuit device is enclosed within the substrate package. In some implementations, two substrate portions with identical polygonal shapes are cut and a recess at least as large as the integrated circuit device is formed in one of the portions, and the integrated circuit device is inserted into the recess. Alternatively, respective recesses can be formed in both substrate portions with a combined depth sufficient to contain the integrated circuit device. The two substrate portions are then bonded together.

At 904, individual contacts within the array of contacts are electrically coupled to individual terminals of the integrated circuit device. As noted above, this coupling is performed using any suitable technique, such as wirebonding or flip-chip techniques. The coupling is performed after the integrated circuit device is placed in the recess of a first one of the polygonal substrate portions, but before the second polygonal substrate portion is bonded to the first one of the polygonal substrate portions.

Thus it is seen that a polygonal BGA semiconductor package with reduced signal skew and reduced high-frequency losses has been provided.

As used herein and in the claims which follow, the construction "one of A and B" shall mean "A or B."

It is noted that the foregoing is only illustrative of the principles of the invention, and that the invention can be practiced by other than the described embodiments, which are presented for purposes of illustration and not of limitation, and the present invention is limited only by the claims which follow.

What is claimed is:

1. A ball grid array (BGA) package for an integrated circuit device, the BGA package comprising:
    an integrated circuit device having two largest dimensions that define a major plane, the integrated circuit device having a plurality of terminals;
    a package substrate material enclosing the integrated circuit device, the package substrate material being formed, in a plane parallel to the major plane of the integrated circuit device, into a polygon having at least five sides; and
    an array of contacts on an exterior surface of the package substrate material, individual contacts within the array of contacts being electrically coupled to individual terminals in the plurality of terminals, contacts in the array of contacts being distributed in a pattern of contact positions, the pattern of contact positions being divided into a first sub-pattern of contact positions and a second sub-pattern of contact positions, the second sub-pattern of contact positions being interspersed within the first sub-pattern of contact positions.

2. The BGA package of claim 1, wherein the package substrate material is formed, in the plane parallel to the major plane of the integrated circuit device, into a hexagon.

3. The BGA package of claim 1, wherein the package substrate material is formed, in the plane parallel to the major plane of the integrated circuit device, into an octagon.

4. The BGA package of claim 1, wherein contacts in the array of contacts, that are located on a surface of a portion of the package substrate material that intersects any normal to the major plane of the integrated circuit device, are coupled to power terminals of the integrated circuit device.

5. The BGA package of claim 4, wherein contacts in the array of contacts that are located on a surface of a portion of the package substrate material other than the portion that intersects any normal to the major plane of the integrated circuit device are coupled to input/output terminals of the integrated circuit device.

6. The BGA package of claim 1, wherein each contact position has a center, and the center of each contact position is separated from the center of each nearest other position by a separation distance that is identical throughout the pattern.

7. The BGA package of claim 6, wherein in at least a portion of the package:
    each contact position in the first sub-pattern is occupied by a contact; and
    each contact position in the second sub-pattern lacks a contact and is available for insertion of at least one via.

8. The BGA package of claim 7, wherein, at at least one contact position in the second sub-pattern, a via having a first diameter is inserted, and at least one additional via, having a second diameter smaller than the first diameter, is inserted adjacent the via having the first diameter.

9. The BGA package of claim 8, wherein the at least one additional via comprises a plurality of additional vias, each having the second diameter, distributed equiangularly around the via having the first diameter.

10. The BGA package of claim 7, wherein the second sub-pattern of contact positions consists of every third position in the pattern of contact positions.

11. The BGA package of claim 7, wherein the at least a portion of the package comprises any portion of the package that intersects any normal to the major plane of the integrated circuit device.

12. A method for fabricating a ball grid array (BGA) package for an integrated circuit device, the integrated circuit device having two largest dimensions that define a major plane, the integrated circuit device further having a plurality of terminals, the method comprising:
    forming a package substrate material into a shape, in a plane parallel to the major plane of the integrated circuit device, that is a polygon having at least five sides;
    providing a package substrate material having an array of contacts on an exterior surface of the package substrate material;
    distributing the contacts of the array of contacts in a pattern of contact positions, including a first sub-pattern of contact positions within the pattern of contact positions and a second sub-pattern of contact positions interspersed within the first sub-pattern of contact positions;
    enclosing the integrated circuit device within the package substrate material; and
    electrically coupling individual contacts within the array of contacts to individual terminals in the plurality of terminals.

13. The method of claim 12, wherein the forming the package substrate material comprises forming the package substrate material into a hexagonal shape.

14. The method of claim 12, wherein the forming the package substrate material comprises forming the package substrate material into an octagonal shape.

15. The method of claim 12, further comprising coupling contacts in the array of contacts, that are located on a surface of a portion of the package substrate material that intersects any normal to the major plane of the integrated circuit device, to power terminals of the integrated circuit device.

16. The method of claim 15, further comprising coupling contacts in the array of contacts, that are located on a surface of a portion of the package substrate material other than the portion that intersects any normal to the major plane of the integrated circuit device, to input/output terminals of the integrated circuit device.

17. The method of claim 12, wherein the distributing the contacts of the array of contacts in the pattern of contact positions comprises distributing the contacts in a pattern in which each contact position has a center, and the center of each contact position is separated from the center of each nearest other position by a separation distance that is identical throughout the pattern.

18. The method of claim 17, wherein the distributing the contacts of the array of contacts in the pattern of contact positions comprises, in at least a portion of the package substrate material:
    placing a contact in each contact position in the first sub-pattern of contact positions within the pattern of contact positions; and
    leaving each contact position in the second sub-pattern of contact positions available for insertion of a via.

19. The method of claim 18, further comprising:
- inserting, at at least one contact position in the second sub-pattern, a via having a first diameter; and
- inserting at least one additional via, having a second diameter smaller than the first diameter, adjacent the via having the first diameter.

20. The method of claim 19, wherein the inserting at least one additional via comprises inserting a plurality of additional vias, each having the second diameter, distributed equiangularly around the via having the first diameter.

21. The method of claim 18, wherein leaving each contact position in the second sub-pattern of contact positions available for insertion of a via consists of leaving every third contact position in the pattern of contact positions available for insertion of a via.

22. The method of claim 18, wherein the placing and the leaving are performed only in the portion of the package substrate material, the portion being characterized by intersecting any normal to the major plane of the integrated circuit device.

\* \* \* \* \*